US008065651B2

(12) United States Patent
Kapur et al.

(10) Patent No.: US 8,065,651 B2
(45) Date of Patent: Nov. 22, 2011

(54) IMPLEMENTING HIERARCHICAL DESIGN-FOR-TEST LOGIC FOR MODULAR CIRCUIT DESIGN

(75) Inventors: Rohit Kapur, Cupertino, CA (US); Anshuman Chandra, Mountain View, CA (US); Yasunari Kanzawa, Sunnyvale, CA (US); Jyotirmoy Saikia, Bangalore (IN)

(73) Assignee: Synopsys, Inc., Mountain View, CA (US)

( * ) Notice: Subject to any disclaimer, the term of this patent is extended or adjusted under 35 U.S.C. 154(b) by 370 days.

(21) Appl. No.: 12/362,284

(22) Filed: Jan. 29, 2009

(65) Prior Publication Data

US 2010/0192030 A1   Jul. 29, 2010

(51) Int. Cl.
    *G06F 17/50* (2006.01)
(52) U.S. Cl. .................. 716/136; 716/106; 714/724
(58) Field of Classification Search .................. 716/106, 716/136; 714/724
    See application file for complete search history.

(56) References Cited

U.S. PATENT DOCUMENTS

| 5,157,781 | A  | * | 10/1992 | Harwood et al. | 714/30 |
|---|---|---|---|---|---|
| 5,815,512 | A  | * | 9/1998 | Osawa et al. | 714/726 |
| 5,991,898 | A  | * | 11/1999 | Rajski et al. | 714/30 |
| 6,826,721 | B2 | * | 11/2004 | Williamson et al. | 714/725 |
| 7,348,796 | B2 | * | 3/2008 | Crouch et al. | 326/38 |
| 7,395,473 | B2 | * | 7/2008 | Cheng et al. | 714/729 |
| 7,512,508 | B2 | * | 3/2009 | Rajski et al. | 702/118 |
| 7,512,851 | B2 | * | 3/2009 | Wang et al. | 714/726 |
| 7,729,884 | B2 | * | 6/2010 | Huang et al. | 702/185 |
| 7,814,444 | B2 | * | 10/2010 | Wohl et al. | 716/100 |
| 7,823,034 | B2 | * | 10/2010 | Wohl et al. | 714/726 |
| 2005/0055617 | A1 | * | 3/2005 | Wang et al. | 714/727 |
| 2006/0111873 | A1 | * | 5/2006 | Huang et al. | 702/185 |
| 2006/0156144 | A1 | * | 7/2006 | Cheng et al. | 714/742 |
| 2008/0195346 | A1 | * | 8/2008 | Lin et al. | 702/119 |
| 2009/0083597 | A1 | * | 3/2009 | Gizdarski | 714/729 |
| 2010/0017760 | A1 | * | 1/2010 | Kapur et al. | 716/2 |
| 2010/0100781 | A1 | * | 4/2010 | Wohl et al. | 714/728 |

* cited by examiner

*Primary Examiner* — Naum Levin
(74) *Attorney, Agent, or Firm* — Park, Vaughan, Fleming & Dowler LLP; Laxman Sahasrabuddhe

(57) ABSTRACT

Embodiments of the present invention provide methods and apparatuses for implementing hierarchical design-for-test (DFT) logic on a circuit. The hierarchical DFT logic implements DFT circuitry that can be dedicated to a module, and which can configure DFT circuitry for multiple modules to share a sequential input signal and/or to share a sequential output signal. During operation, the DFT circuitry for a first module can propagate a bit sequence from the sequential input signal to the DFT circuitry of a second module, such that the bit sequence can include a set of control signal values for controlling the DFT circuitry, and can include compressed test vectors for testing the modules. Furthermore, the DFT circuitry for the second module can generate a sequential response signal, which combines the compressed response vectors from the second module and a sequential response signal from the DFT circuitry of the first module.

21 Claims, 12 Drawing Sheets

IMPLEMENTING HIERARCHICAL DESIGN-FOR-TEST LOGIC FOR MODULAR CIRCUIT DESIGN

BACKGROUND

1. Field

This disclosure is generally related to electronic design automation. More specifically, this disclosure is related to methods and apparatuses for implementing a hierarchical design-for-test (DFT) logic for a modular circuit design.

2. Related Art

Dramatic improvements in semiconductor manufacturing technologies have made it possible to integrate tens of millions of devices onto a single IC (integrated circuit). These developments have given rise to new challenges in the design and manufacture of semiconductor chips. Specifically, chip testing has become one of the most challenging aspects of circuit design.

A circuit-under-test (CUT) can be viewed as a combinational and/or a sequential logic with inputs and outputs. A CUT can be tested by first applying test vectors to inputs of the CUT and capturing its outputs. A fault in the CUT can then be identified by comparing the CUT's actual outputs with a "good" chip's outputs. A common technique for testing chips involves augmenting the CUT with design-for-test (DFT) circuitry, which includes flip-flops that apply test vectors to the CUT and capture response outputs from the CUT. Usually, test vectors are scanned into a set of flip-flops which are coupled with the CUT's inputs. Next, the chip is clocked and the CUT's response values are captured in a second set of flip-flops, which can then be scanned out. Finally, the response values can be used to determine whether the CUT has a fault.

In designs with multiple modules, each module of the CUT can be augmented with dedicated DFT circuitry to test these modules. Unfortunately, in designs with a large number of modules, sharing the test inputs of the CUT is not practical. Specifically, either the test inputs of the CUT have to be partitioned across the set of modules, or the modules need to take turns in receiving test vectors from the test inputs. Both of these approaches have serious drawbacks.

Specifically, partitioning the test inputs can severely limit the number of bits that can be used to represent a test vector for a module, and/or can require a CUT to have an impractically high number of test input pins. Specifically, approaches that use compression scan chains usually require at least five test pins per module. Hence, the partitioning approach would clearly be impractical if the CUT has a large number of modules that use compression scan chains, and each module requires five test input pins on the packaging. The second approach, in which the modules take turns receiving test vectors from the test inputs, is undesirable because it only allows one module to be tested at a time. This can increase the time required for testing a CUT, and can make it difficult, if not impossible, to test interactions between modules of the CUT.

SUMMARY

Some embodiments of the present invention provide methods and apparatuses for testing a circuit. More specifically, some embodiments enable hierarchical DFT implementations with flat automatic test pattern generation (ATPG).

Some embodiments can reduce test data and test application time in a hierarchical and low pin count environment. An active test access mechanism can be used that becomes part of the compression schemes and unifies the test data for multiple compressor-decompressor (CODEC) implementations.

Note that a CUT can include multiple DFT cores. Each DFT core can include a set of test inputs configured to receive a compressed test vector, a combinational decompression logic, a combinational compression logic, and a set of response outputs. During operation, the set of test inputs can receive a compressed test vector, the combinational decompression logic can decompress the compressed test vector to generate an uncompressed test vector, and the uncompressed test vector can be scanned into a set of scan chains. After capture, the response vector can be scanned out of the set of scan chains, the combinational compression logic can generate a compressed response vector by compressing the response vector, and the set of response outputs can receive the compressed response vector.

Some embodiments of the present invention interface a DFT core's test inputs with a series of flip-flops which is used to receive an input bit stream which is associated with the compressed test vector for the DFT core. Some flip-flops in the series of flip-flops may be coupled to an array of flip-flops which are configured to provide constant input values to the combinational decompression logic. A CUT with multiple DFT cores will have multiple series of flip-flops, wherein each series of flip-flops is interfaced with a particular DFT core's test inputs. These multiple series of flip-flops can be linked together to form one or more long series of flip-flops. These long series of flip-flops can then be used to supply the compressed test vectors for the multiple DFT cores. In some embodiments, the compressed test vectors can be inputted into the long series of flip-flops in a forward direction or a backward direction.

Similarly, a DFT core's test outputs can be interfaced with a series of flip-flops which is used to generate an output bit stream which is associated with the compressed response vector for the DFT core. A CUT with multiple DFT cores will have multiple series of flip-flops, wherein each series of flip-flops is interfaced with a particular DFT core's test outputs. These multiple series of flip-flops can be linked together to form one or more long series of flip-flops. These long series of flip-flops can then be used to output the compressed response vectors for the multiple DFT cores. In some embodiments, the compressed response vectors can be outputted out of the long series of flip-flops in a forward direction or a backward direction.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Integrated Circuit (IC) Design Flow

Figure 1:
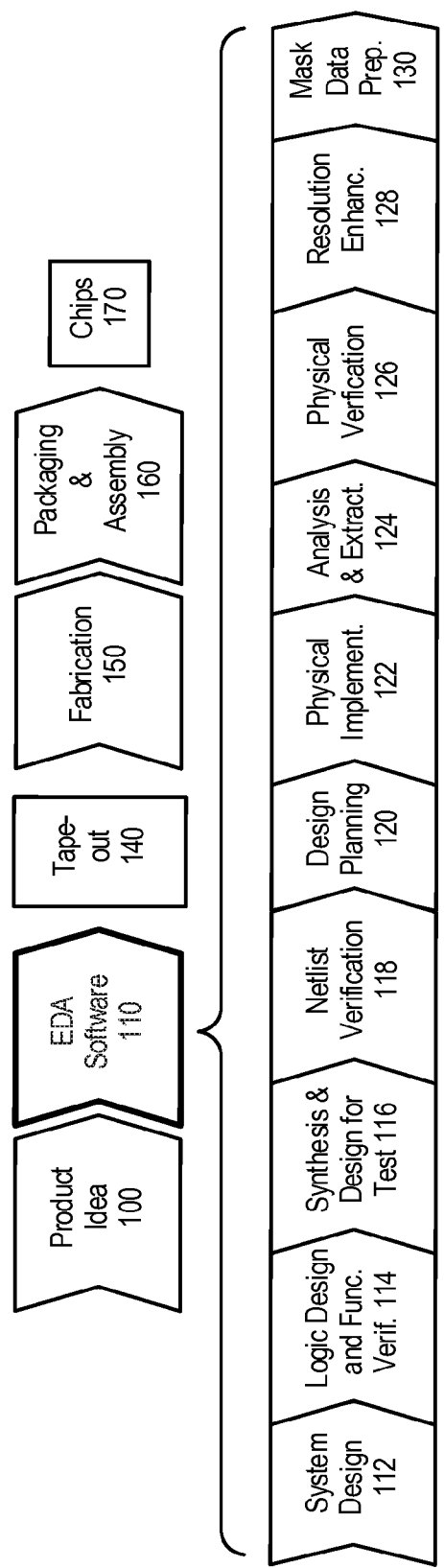
FIG. 1 illustrates various stages in the design and fabrication process of an integrated circuit in accordance with an embodiment.

FIG. 1 illustrates various stages in the design and fabrication process of an integrated circuit in accordance with an embodiment of the present invention.

The IC design process typically begins with a product idea (operation 100) which is realized using an EDA process (operation 110). Once the design is finalized, it is typically taped-out (event 140), at which point it goes through a fabrication process (operation 150) and packaging and assembly processes (operation 160) to produce manufactured microchips (result 170).

The EDA process (operation 110) comprises operations 112-130, which are described below for illustrative purposes only and are not meant to limit the present invention. Specifically, an actual integrated circuit design may require a designer to perform the design operations in a different sequence than the sequence described below.

System design (operation 112): In this stage, the designers describe the functionality that implements the product idea. They can also perform what-if planning to refine the functionality, perform cost analysis, etc. Hardware-software architecture partitioning can occur at this stage. Exemplary EDA software products from Synopsys, Inc. that can be used at this stage include Model Architect, Saber®, System Studio, and DesignWare®.

Logic design and functional verification (operation 114): At this stage, the VHDL or Verilog code for modules in the system is written and the design is checked for functional accuracy. More specifically, the design is checked to ensure that it produces a correct response. Exemplary EDA software products from Synopsys, Inc. that can be used at this stage include VCS®, Vera®, DesignWare®, Magellan™, Formality®, ESP and Leda®.

Synthesis and design for test (operation 116): The VHDL/Verilog source code can be translated to a netlist in this stage. The netlist can be optimized for the target technology, and tests can be designed and implemented to check the manufactured microchips. Exemplary EDA software products from Synopsys, Inc. that can be used at this stage include Design Compiler®, Physical Compiler®, Test Compiler, Power Compiler™, FPGA Compiler, TetraMAX®, and DesignWare®.

Netlist verification (operation 118): In this stage, the netlist is checked for compliance with timing constraints and for correspondence with the VHDL/Verilog source code. Exemplary EDA software products from Synopsys, Inc. that can be used at this stage include Formality®, PrimeTime®, and VCS®.

Design planning (operation 120): In this stage, an overall floorplan for the microchip is constructed and analyzed for timing and top-level routing. Exemplary EDA software products from Synopsys, Inc. that can be used at this stage include Astro™ and IC Compiler products.

Physical implementation (operation 122): The placement (positioning of circuit elements) and routing (placement of interconnections) occur at this stage. Exemplary EDA software products from Synopsys, Inc. that can be used at this stage include Astro™ and IC Compiler products.

Analysis and extraction (operation 124): At this stage, the circuit function is verified at a transistor level; this, in turn, permits what-if refinement. Exemplary EDA software products from Synopsys, Inc. that can be used at this stage include AstroRail™, PrimeRail, PrimeTime®, and Star-RCXT™.

Physical verification (operation 126): In this stage, the design is checked to ensure correctness for manufacturing, electrical issues, lithographic issues, and circuitry. Hercules™ is an exemplary EDA software product from Synopsys, Inc. that can be used at this stage.

Resolution enhancement (operation 128): This stage involves geometric manipulations of the layout to improve manufacturability of the design. Exemplary EDA software products from Synopsys, Inc. that can be used at this stage include Proteus/Progen, ProteusAF, and PSMGen.

Mask data preparation (operation 130): This stage provides the "tape-out" data for production of masks to produce finished chips. Exemplary EDA software products from Synopsys, Inc. that can be used at this stage include the CATS® family of products.

Overview

Circuits-under-test (CUTs) typically include design-for-test (DFT) circuitry which facilitates testing the CUT after fabrication. This DFT circuitry can include decompression logic, which decompresses a test vector and scans the decompressed test vector into flip-flops that apply the test vectors to the CUT. Furthermore, the DFT circuitry can also include compression logic, which scans-out a response vector from the CUT and compresses the response vector before propagating it to the CUT's outputs. These compressed response outputs can be used to determine whether the CUT has a fault.

DFT logic that encompasses a circuit design as a whole (i.e., it is implemented as a flat compression solution at the top level of a circuit design) is not typically limited by the number of available test pins. However, chip manufacturers are moving toward a design process where the modules of the circuit design are augmented with a dedicated DFT core before the module is incorporated into the final chip. This results in a circuit design where the individual modules employ customized compression/decompression (CODEC) logic for their DFT cores, thereby requiring that the CUT implement a test access mechanism (TAM) which is capable of providing compressed test vectors to the hierarchical DFT cores without requiring an unreasonable number of test pins at the top level.

Figure 2A:
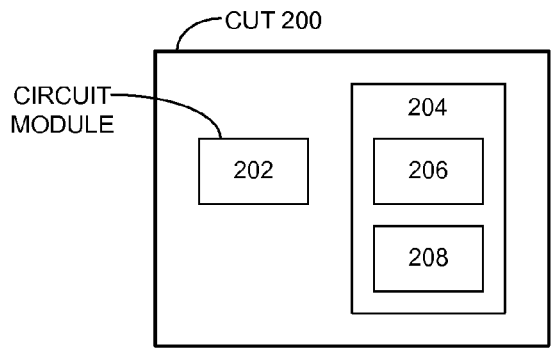
FIG. 2A illustrates a CUT implemented with multiple nested circuit modules.

FIG. 2A illustrates a CUT implemented with multiple nested circuit modules. In designs with multiple modules (e.g., CUT 200 with modules 202-208), each module of the CUT can be augmented with a dedicated DFT core to provide focused tests to the module. Unfortunately, typical CODEC technology is not hierarchical in nature, which can require hierarchical CUTs to implement a TAM that can direct a test vector to the DFT core for a specific module.

Figure 2B:
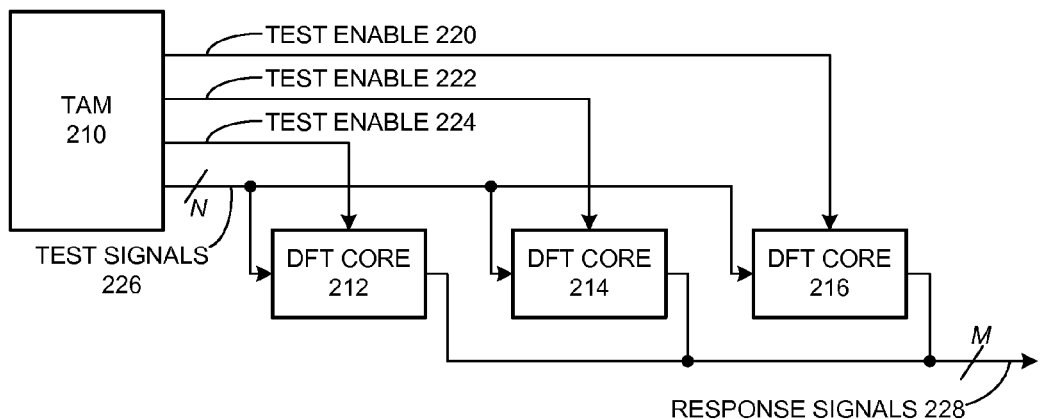
FIG. 2B illustrates a DFT implementation which shares test signals across DFT cores for a number of modules.

FIG. 2B illustrates a DFT implementation which shares test signals across DFT cores for a number of modules. This DFT implementation includes a TAM 210, which propagates a test vector to DFT cores 212-216 through test signals 226, and includes a number of test-enable signals 220-224 for activating a test on DFT cores 212-216. TAM 210 can activate one DFT core from DFT cores 212-216 for testing a corresponding module by activating a corresponding test-enable signal (e.g., test-enable signal 220 for DFT core 216), and the activated DFT core propagates its response vector on response signals 228. However, given that only one DFT core can be activated at a time, this DFT implementation cannot test the interactions between modules with dedicated DFT cores.

Figure 2C:
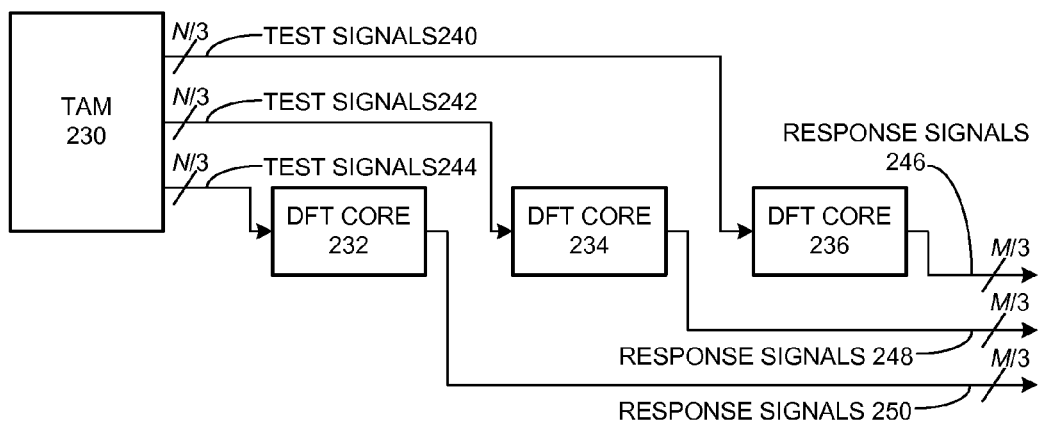
FIG. 2C illustrates a DFT implementation which partitions test signals across DFT cores for a number of modules.

FIG. 2C illustrates a DFT implementation which partitions test signals across DFT cores for a number of modules. This DFT implementation includes a TAM 230, which propagates test vectors to DFT cores 232-236 through test signals 240-244 simultaneously, and DFT core 232-236 propagate their response vectors through response signals 246-250. TAM 230 can therefore perform tests on multiple modules simultaneously, but at the cost of restricting the size for a given test vector.

Embodiments of the present invention provide methods and apparatuses for implementing a hierarchical DFT solution on a hierarchical CUT with multiple modules. In some embodiments, the hierarchical DFT solution can implement a flat ATPG solution (i.e., tests are inserted and responses are received from signals at a global level) by implementing a TAM within the DFT logic of a respective module. During operation, a sequential input signal can propagate a bit sequence into the DFT logic for a module, such that the bit sequence can include a set of control signal values for controlling operating modes of the DFT logic, and can include a compressed test vector for testing the module. Then, the TAM can propagate these control signal values and compressed test vectors from the bit sequence to the DFT core of the module in a per-shift basis to apply a variation of test vectors and DFT configurations to the DFT core. At the same time, the TAM can capture compressed response vectors from the DFT core to generate a sequential response signal.

DFT Architecture

Figure 3:
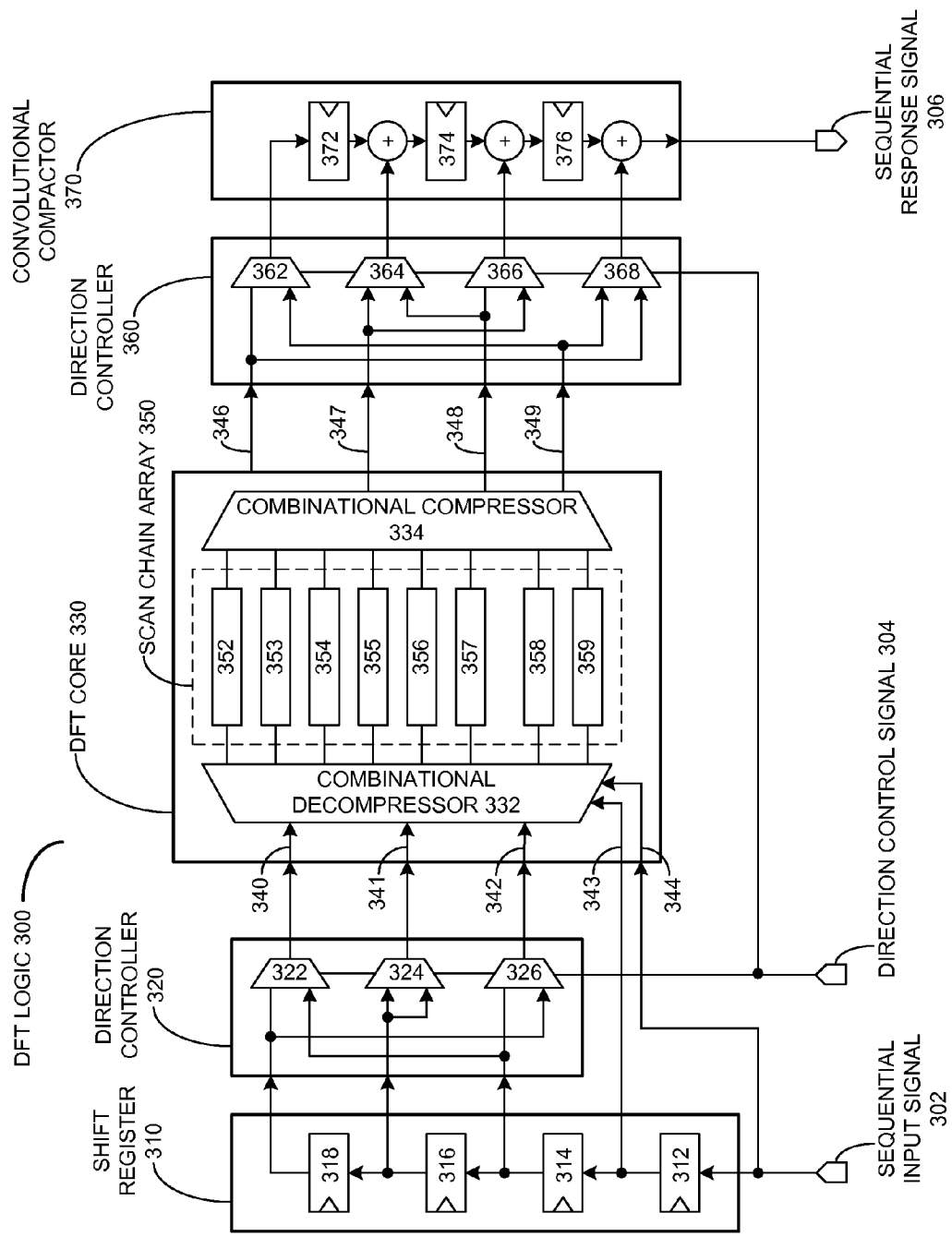
FIG. 3 illustrates a DFT logic for testing a circuit in accordance with an embodiment.

FIG. 3 illustrates a DFT logic for testing a circuit in accordance with an embodiment. DFT logic 300 can include a shift register 310, direction controllers 320 and 360, a DFT core 330, and a convolutional compactor 370. In some embodiments, DFT core 330 can include a set of test inputs 340-342, a set of control inputs 343-344, a combinational decompressor 332, a scan chain array 350, a combinational compressor 334, and a number of response outputs 346-349. Test inputs 340-342 can be configured to receive a compressed test vector, and combinational decompressor 332 can be configured to decompress the compressed test vector to generate an uncompressed test vector. In some embodiments, combinational decompressors and compressors are configured to supply and observe a large number of scan chains from a small interface. When a fixed number of flip-flops are required to provide tests to a module, a DFT logic implementation with a ratio of 3× more internal chains (e.g., scan chains 353-357) than test inputs (e.g., test inputs 340-342) translates to scan chains which are 3× shorter in length, which can reduce the test data volume and the time required to apply these tests.

The uncompressed test vector is scanned into a set of scan chains (e.g., scan chains 352-357), and DFT core 330 enables the uncompressed test vector to propagate through the logic of the circuit. Then, the set of scan chains are configured to gather a response vector from the circuit, and the response vector is scanned out of the set of scan chains. In some embodiments, control signals for DFT core 330 (e.g., inputs 343-344) are propagated through scan chain array 350 along with their corresponding uncompressed test vector and uncompressed response vector by dedicating a number of scan chains (e.g., scan chains 358-359) to propagating the control signals from combinational decompressor 332 to combinational compressor 334. Doing so allows a set of control signals to synchronize the modes of operation for combinational decompressor 332 and combinational compressor 334 as test vectors and their response vectors propagate through scan chain array 350.

Combinational compressor 334 is configured to generate a compressed response vector by compressing a response vector that is scanned out of the set of scan chains, and a set of response outputs 346-349 are configured to receive the compressed response vector. In some embodiments, combinational compressor 334 is implemented using a tree of exclusive-OR logic gates, based in part on the Steiner triple system. In some embodiments, combinational compressor 334 includes masking logic to handle X's (i.e., don't care values) in the response vector.

DFT core 330 has two types of input signals: control inputs and test inputs. An input stream which propagates into shift register 310 through sequential input signal 302 propagates to control signals 343-344 before propagating to test inputs 340-342. This configuration enables control signals 343-344 to propagate control signal values to DFT core 330 which are appropriate for a given test vector, thereby providing DFT core 330 with a per-shift reconfiguration capability. In some embodiments, shift register 310 implements the TAM for DFT core 330, such that test inputs 340-342 propagate a compressed test vector into DFT core 330, and control signals 343-344 control the testing functionality of DFT core 330 on a per-shift basis. Implementing the role of a TAM in a shift register for a DFT core facilitates reducing the number of pins required to provide control signals and test vectors to the DFT core, and facilitates increasing the reachability and testability of faults by compressed test vectors.

In some embodiments, shift register 310 is configured to receive an input bit stream associated with the compressed test vector from a sequential input signal 302, and to propagate the compressed test vector to test inputs 340-342 of DFT core 330. Shift register 310 includes a set of flip-flops 312-318 configured in series, such that the data output of one flip-flop is coupled to the data input of a subsequent flip-flop. Furthermore, a subset of the outputs from shift register 310 (e.g., data outputs from flip-flops 314-318) are configured to provide a test vector to DFT core 330, and the remaining set of outputs from shift register 310 are configured to provide a set of control signals to DFT core 330. In some variations, the test vector outputs from shift register 310 are coupled directly to test inputs 340-342 of DFT core 330. In other variations, the test vector outputs from shift register 310 are interfaced with test inputs 340-342 of DFT core 330 by direction controller 320. In some embodiments, shift register 310 is driven by the same clock signal as DFT core 330, thereby allowing a value to propagate simultaneously through shift register 310 and DFT core 330.

In some embodiments, direction controller 320 is configured to interface the test vector outputs of shift register 310 with test inputs 340-342 of DFT core 330. Direction controller 320 can include a set of multiplexers 322-326, which can be configured to input the compressed test vector into the test inputs of DFT core 330 in a forward bitwise direction or in a reverse bitwise direction. That is, a first data input of a multiplexer 322 in direction controller 320 is coupled to the output of a flip-flop in shift register 310 which is associated with a forward bitwise direction (e.g., data output from flip-flop 318), and a second data input of multiplexer 322 is coupled to the output of a flip-flop in shift register 310 which is associated with a reverse bitwise direction (e.g., data output from flip-flop 314). This ability to propagate a test vector from shift register 310 to DFT core 330 in a forward or reverse bitwise direction allows a sequence of bits to flow into test inputs 340-342 in bidirectional shifting directions, which can break dependencies created when combining control values and test vectors into a sequential input signal.

Multiplexer 322 in direction controller 320 also includes a select input which is configured to select whether the first data input's value or the second data input's value propagates to the data output of multiplexer 322, such that the data output of multiplexer 322 is coupled to a corresponding test input of DFT core 330 (e.g., test input 340). In some variations on these embodiments, direction controller 320 can be implemented in shift register 310. In other variations, direction controller 320 can be implemented in combinational decompressor 332 of DFT core 330.

In some embodiments, direction controller 360 is configured to interface response outputs 346-349 of DFT core 330 with the response vector inputs of convolutional compactor 370. Direction controller 360 can include a set of multiplexers 362-368, which can be configured to input the compressed response vector into the inputs of convolutional compactor 370 in a forward bitwise direction or in a reverse bitwise direction. That is, a first data input of a multiplexer 362 in direction controller 360 is coupled to a response output of DFT core 330 which is associated with a forward bitwise direction (e.g., response output 346), and a second data input of multiplexer 362 is coupled to a response output of DFT core 330 which is associated with a reverse bitwise direction (e.g., response output 349). Furthermore, multiplexer 362 includes a select input which is configured to select whether the first data input's value or the second data input's value propagates to the data output of multiplexer 362, such that the data output of multiplexer 362 is coupled to a corresponding input of convolutional compactor 370 (e.g., the data input of flip-flop 372). In some variations on these embodiments, direction controller 360 can be implemented in combinational compressor 334 of DFT core 330. In other variations, direction controller 360 can be implemented in convolutional compactor 370.

In some embodiments, convolutional compactor 370 is configured to receive a compressed response vector from DFT core 330, and to generate an output bit stream associated with the compressed response vector. Convolutional compactor 370 can implement a TAM at the output of DFT logic 300, and can include a set of flip-flops 372-376 configured in series, such that an exclusive-OR operator interfaces the data output of one flip-flop with the data input of a subsequent flip-flop. That is, a first input of the exclusive-OR operator is coupled to an output of a flip-flop (e.g., flip-flop 374), a second input of the exclusive-OR operator is coupled to a response output of DFT core 330 (e.g., response output 348), and the output of the exclusive-OR operator is coupled to the data input of a subsequent flip-flop (e.g., flip-flop 376). Using an exclusive-OR operator to interface between two flip-flops in a series of flip-flops allows convolutional compactor 370 to incorporate the response bit from the previous flip-flop into a sequential response signal. The use of a combinational compactor to compress the response vector is for illustration purposes only and is not intended to limit the present invention. Specifically, it will be apparent to one skilled in the art that a number of techniques for compressing a test vector can be used.

In some embodiments, the response vector inputs of convolutional compactor 370 are coupled directly to response outputs 346-349 of DFT core 330. In other embodiments, the response vector inputs of convolutional compactor 370 are interfaced with response outputs 346-349 of DFT core 330 by direction controller 360.

Hierarchical DFT Implementation

In some embodiments, a hierarchical DFT logic can be implemented on a circuit with more than one module to share sequential input and output signals across more than one DFT core. In some embodiments, two modules can be augmented with DFT logic which shares sequential input and output signals when the two modules implement the same (or substantially similar) functionality, or when the two modules have an overlap in their sets of test vectors. In other embodiments, two modules can be augmented with DFT logic which shares sequential input and output signals when the two modules are neighboring modules.

Figure 4:
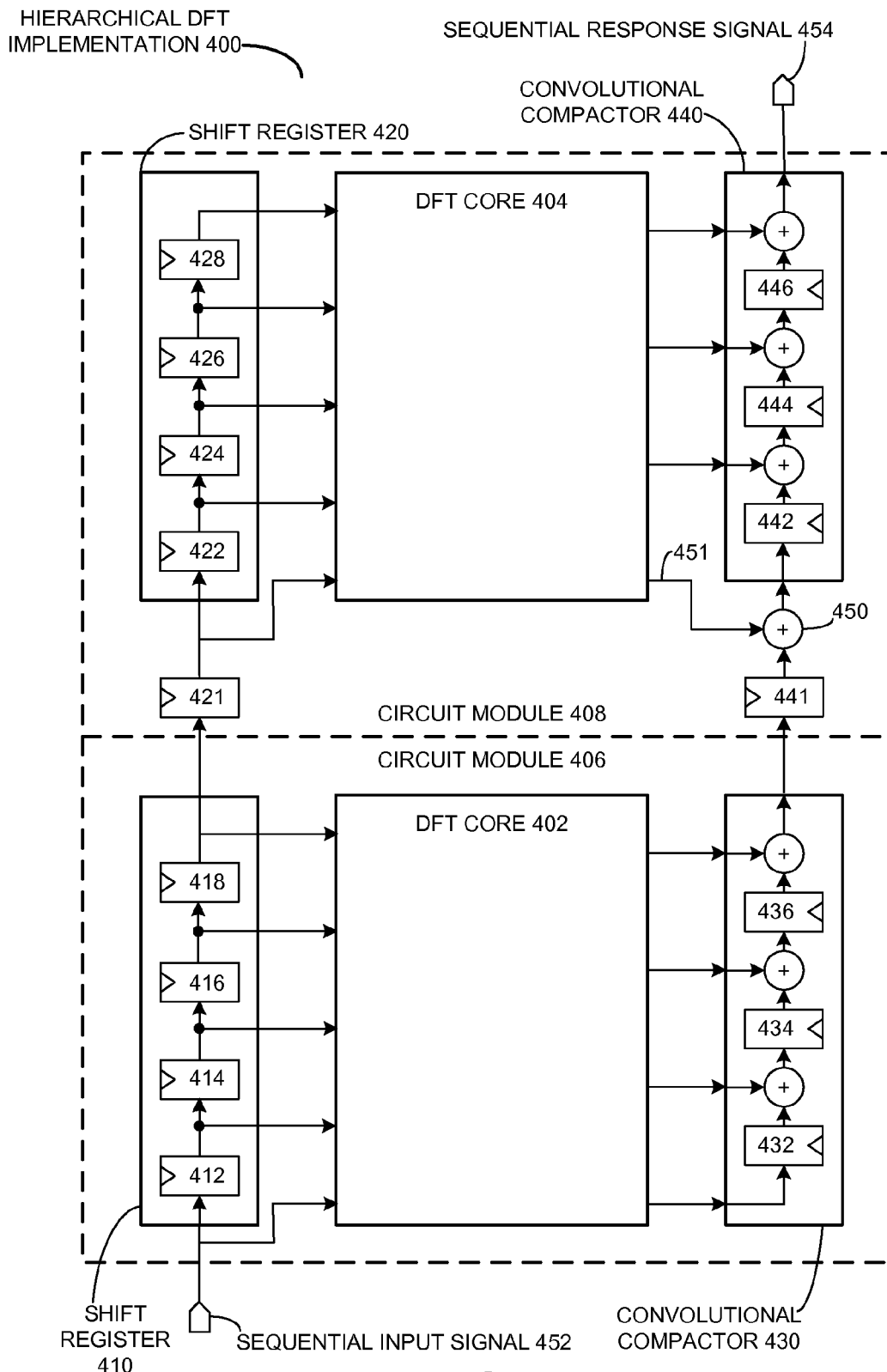
FIG. 4 illustrates a hierarchical DFT implementation in accordance with an embodiment.

FIG. 4 illustrates a hierarchical DFT implementation in accordance with an embodiment. The hierarchical DFT implementation 400 includes a DFT core 402 for a circuit module 406, a DFT core 404 for a circuit module 408, shift registers 410 and 420, and convolutional compactors 430 and 440. DFT core 402 can receive a compressed test vector and control signals from shift register 410, and can propagate a compressed response vector to convolutional compactor 430. Similarly, DFT core 404 can receive a compressed test vector and control signals from shift register 420, and can propagate a compressed response vector to convolutional compactor 440. Hierarchical DFT implementation 400 receives a sequence of bits associated with a compressed test vector from sequential input signal 452, and transmits a sequence of bits associated with a compressed response vector to sequential response signal 454. This configuration which shares sequential input and output signals across shift registers and convolutional compactors for multiple DFT cores allows a hierarchical DFT implementation to provide effective tests while requiring a minimum number of global test pins.

In some embodiments, hierarchical DFT implementation 400 can be constructed by configuring shift register 410 of module 406 to interface sequential input signal 452 to shift register 420 of module 408. Doing so enables the DFT logic for modules 406 and 408 to share sequential input signal 452. This configuration can be achieved by coupling the data output of flip-flop 418 in shift register 410 with the data input for a flip-flop 421, and coupling the data output of flip-flop 421 with the data input of flip-flop 422 in shift register 420. In some embodiments, flip-flop 421 can include an enable control signal which facilitates controlling the flow of data from shift register 410 to DFT core 404.

Furthermore, the hierarchical DFT implementation can be constructed by configuring convolutional compactor 440 of module 408 to interface sequential response signal 454 to convolutional compactor 430 of module 406. Doing so enables the DFT logic for modules 406 and 408 to share sequential response signal 454. This configuration can be achieved by coupling the output of an exclusive-OR operator 450 with the data input of a flip-flop (e.g., flip-flop 442) in convolutional compactor 440, coupling the response signal associated with the flip-flop (e.g., response signal 451) to a first input of exclusive-OR operator 450, coupling the data output of a flip-flop 441 to a second input of exclusive-OR operator 450, and coupling the output of convolutional compactor 430 to the data input of flip-flop 441. Note that, in some embodiments, the output of exclusive-OR operator 450 can be coupled to the data input of any flop-flop in convolutional compactor 440. In some embodiments, flip-flop 441 can include an enable control signal which facilitates controlling the flow of data from convolutional compactor 430 to convolutional compactor 440.

Figure 5:
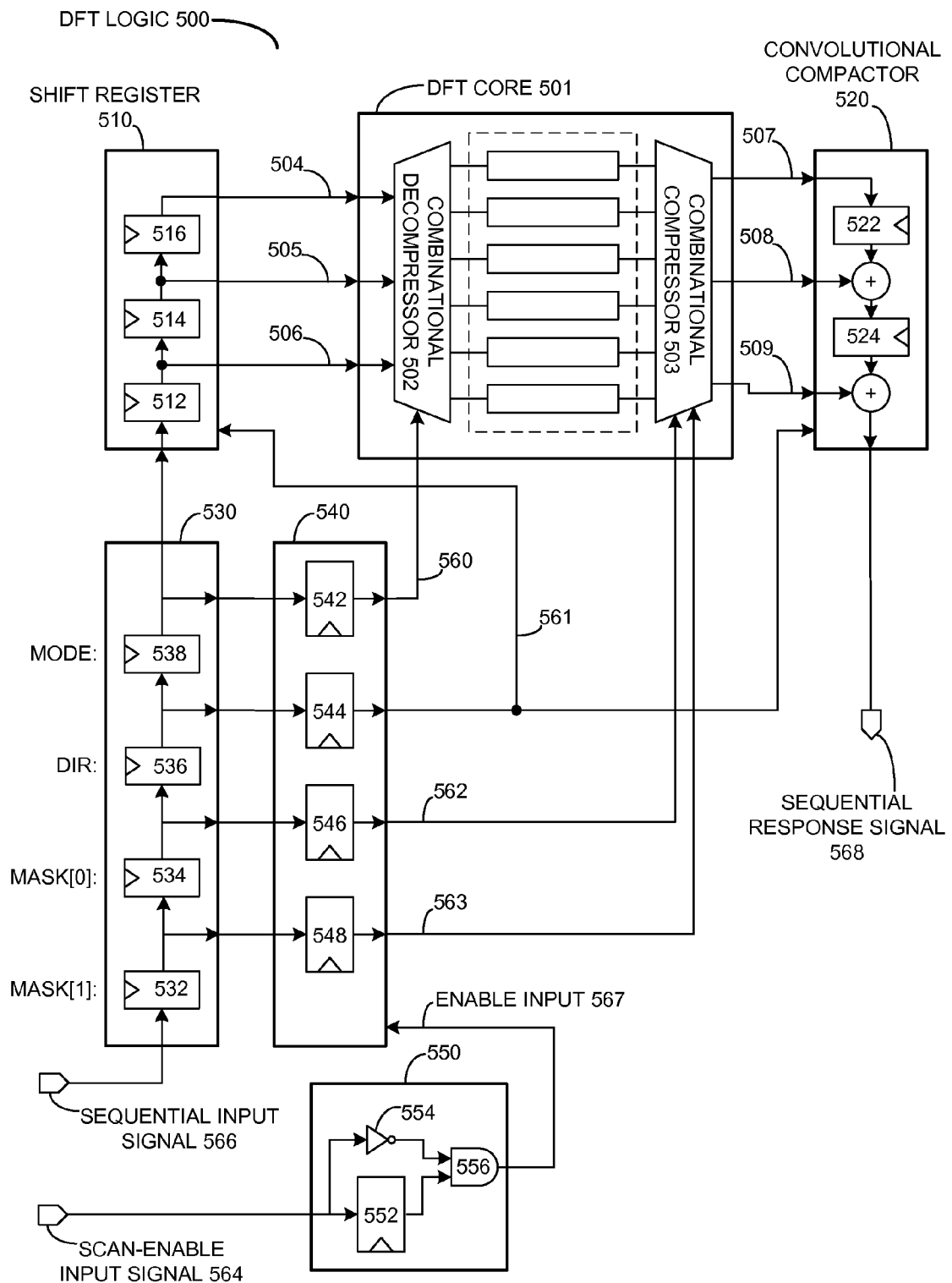
FIG. 5 illustrates a DFT logic coupled to a flip-flop array for providing constant input values to the DFT logic in accordance with an embodiment.

FIG. 5 illustrates a DFT logic coupled to a flip-flop array for providing constant input values to the DFT logic in accordance with an embodiment. DFT logic 500 can include a DFT core 501, shift registers 510 and 530, a convolutional compactor 520, a flip-flop array 540, and a scan-enable logic 550. In some embodiments, shift register 510 can include a number of flip-flops equal to the number of test inputs for DFT core 501. For example, DFT core 501 can include three test inputs (e.g., test inputs 504-506) coupled to the outputs of three flip-flops in shift register 510 (e.g., flip-flops 512-516).

In some embodiments, shift register 530 is configured to interface a sequential input signal 566 to the data input of a flip-flop in shift register 510. Shift register 530 can include a number of flip-flops arranged in series, such that the data input for shift register 530 (i.e., the data input for flip-flop 532) is coupled to sequential input signal 566, and the data output for a flip-flop in the front of the series (i.e. the data output for flip-flop 538) is coupled to the sequential input for shift register 510. In some embodiments, the number of flip-flops in shift register 530 can be equal to the number of control signal inputs for DFT core 501, shift register 510, and convolutional compactor 520. For example, flip-flop 538 can be associated with a mode control signal 560, flip-flop 536 can be associated with a direction control signal 561, flip-flop 534 can be associated with a mask[0] control signal 562, and flip-flop 532 can be associated with a mask[1] control signal 563.

In some embodiments, flip-flop array 540 is configured to interface the data outputs of shift register 530 with the control signal inputs for DFT core 501, shift register 510, and convolutional compactor 520. For example, the data input for flip-flops 542-548 are coupled to the data outputs for flip-flops 538-532, respectively. Furthermore, the data outputs for flip-flops 542-548 are coupled to control signals 560-563, respectively, which control the operations performed by combinational decompressor 502 and combinational compressor 503 of DFT core 501, shift register 510, and convolutional compactor 520. In some embodiments, the number of flip-flops in flip-flop array 540 can be equal to the number of flip-flops in shift register 530.

In some embodiments, flip-flop array 540 is configured to store the data propagated from shift register 530 on the falling edge of a scan-enable input signal 564. In some variations on these embodiments, an enable input signal 567 of flip-flop array 540 can be coupled to an output of a scan-enable logic 550. Scan-enable logic 550 can include a flip-flop 552, an inverter 554, and a Boolean-AND operator 556. Scan-enable input signal 564 can be coupled to the data input for flip-flop 552 and to the input for inverter 554, and the data outputs for flip-flop 552 and inverter 554 can be coupled to inputs of Boolean AND operator 556. Furthermore, the output for Boolean AND operator 556 can be coupled to the enable input signal 567 for flip-flop array 540.

Exemplary Application

Figure 6A:
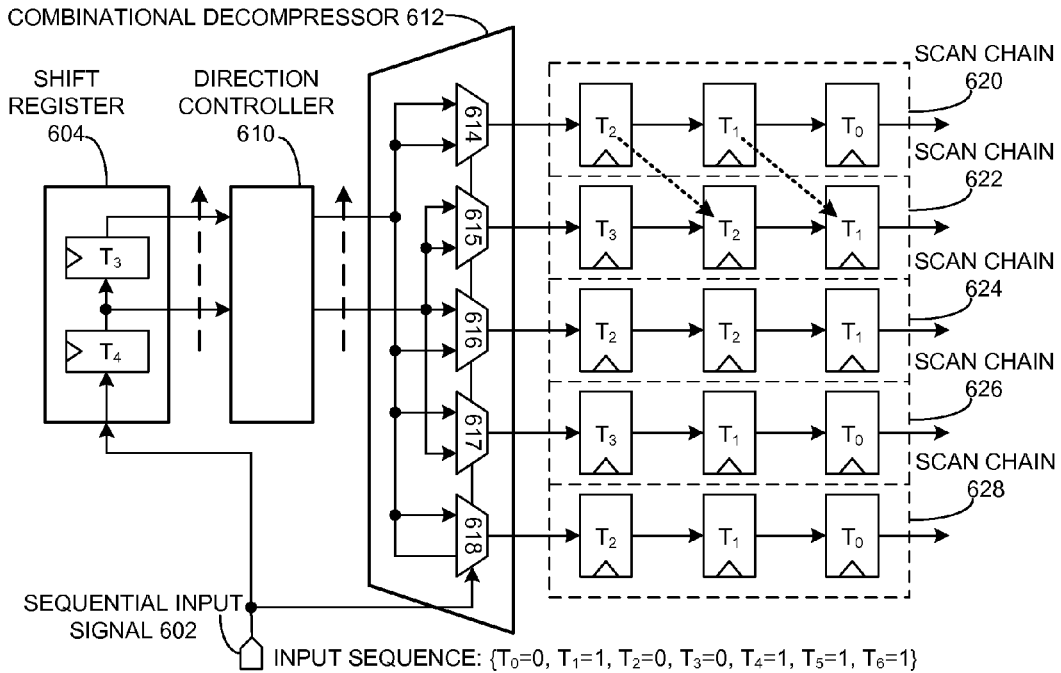
FIG. 6A illustrates an exemplary application for a DFT logic where a direction controller propagates a test vector in a forward direction in accordance with an embodiment.

FIG. 6A illustrates an exemplary application for a DFT logic where a direction controller propagates a test vector in a forward direction in accordance with an embodiment. The DFT logic includes a sequential input signal 602, a shift register 604, a direction controller 610, a combinational decompressor 612, and scan chains 620-628. During operation sequential input signal 602 receives a compressed test sequence $\{T_0=0, T_1=1, T_2=0, T_3=0, T_4=1, T_5=1, T_6=1\}$, and the test sequence is scanned into shift register 604 over a number of clock cycles. At the same time, combinational compressor 612 receives compressed test vectors from shift register 604, and receives "mode" control values from sequential input signal 602.

In this example, direction controller 610 is configured in a forward direction, and shift register 604 and scan chains 620-628 illustrate the values stored across a set of flip-flops during a fifth clock cycle (i.e., when test $T_5$ arrives at sequential input signal 602). Note that the vertical data dependency along shift register 604 can translate into diagonal dependencies across scan chains 620-628. More specifically, scan chains 620 experiences a forward diagonal dependency on scan chain 622 (illustrated by a diagonal dotted arrow).

The diagonal dependencies created are dependent on the direction of data flow, and on the input value to the mode control signal for the combinational decompressor. By reversing the direction for the input vector for combinational decompressor 612, the dependencies across scan chains 620-628 can be reversed. This can greatly improve the quality of a compressed test vector. Furthermore, changing the direction of the compressed test vector can causes the X canceling effect to change as well, thereby enhancing response observation.

Figure 6B:
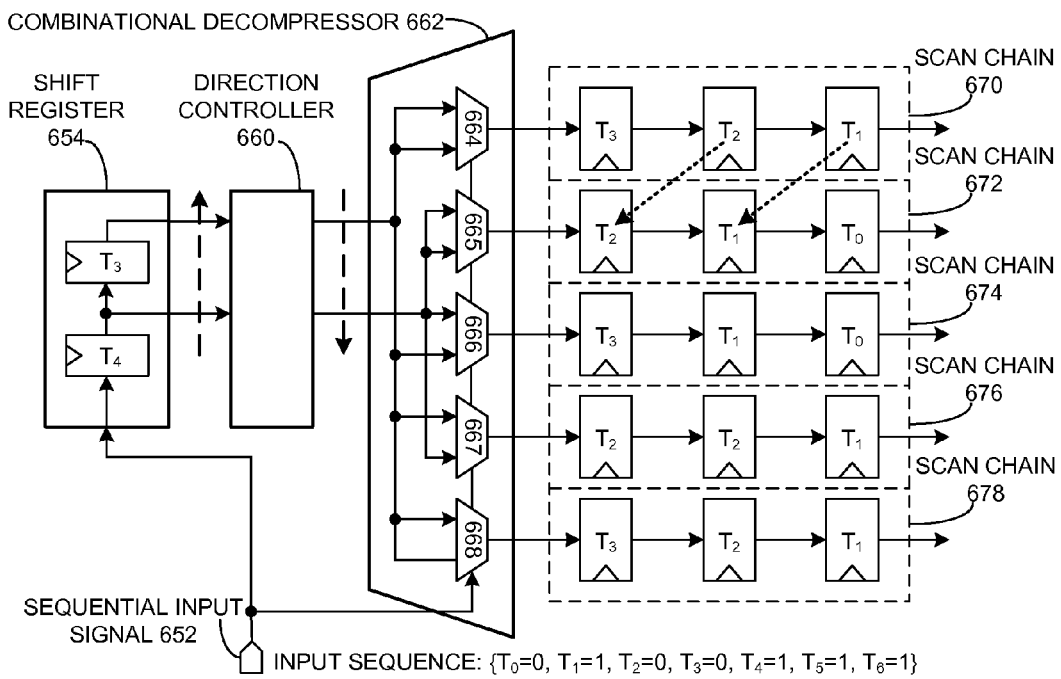
FIG. 6B illustrates an exemplary application for a DFT logic where a direction controller propagates a test vector in a reverse direction in accordance with an embodiment.

FIG. 6B illustrates an exemplary application for a DFT logic where a direction controller propagates a test vector in a reverse direction in accordance with an embodiment. The DFT logic includes a sequential input signal 652, a shift register 654, a direction controller 660, a combinational decompressor 662, and scan chains 670-678. During operation, sequential input signal 625 receives a compressed test sequence $\{T_0=0, T_1=1, T_2=0, T_3=0, T_4=1, T_5=1, T_6=1\}$, and the test sequence is scanned into shift register 654 over a number of clock cycles. At the same time, combinational compressor 662 receives compressed test vectors from shift register 654, and receives "mode" control values from sequential input signal 652.

In this example, direction controller 660 is configured in a reverse direction, and shift register 654 and scan chains 670-678 illustrate the values stored across a set of flip-flops at time $T_5$ when direction controller 660 is configured in a reverse direction. Note that scan chain 670 experiences a reverse diagonal dependency on scan chain 672 (illustrated by a diagonal dotted arrow), which differs from the forward diagonal dependencies between scan chains 620 and 622 of FIG. 6A.

In some embodiments, the direction signal can vary at every shift operation, thereby allowing scan chains to receive further variations on the test sequence. Note that altering the value for the direction control signal while scanning test vectors into a set of scan chains can produce a test pattern across the flip-flops of the scan chains which is a combination of the two possible test patterns associated with each direction. More specifically, a column of flip-flops from a scan chain array has a set of test values associated with either a forward configuration or a reverse configuration of the direction controller.

Figure 7:
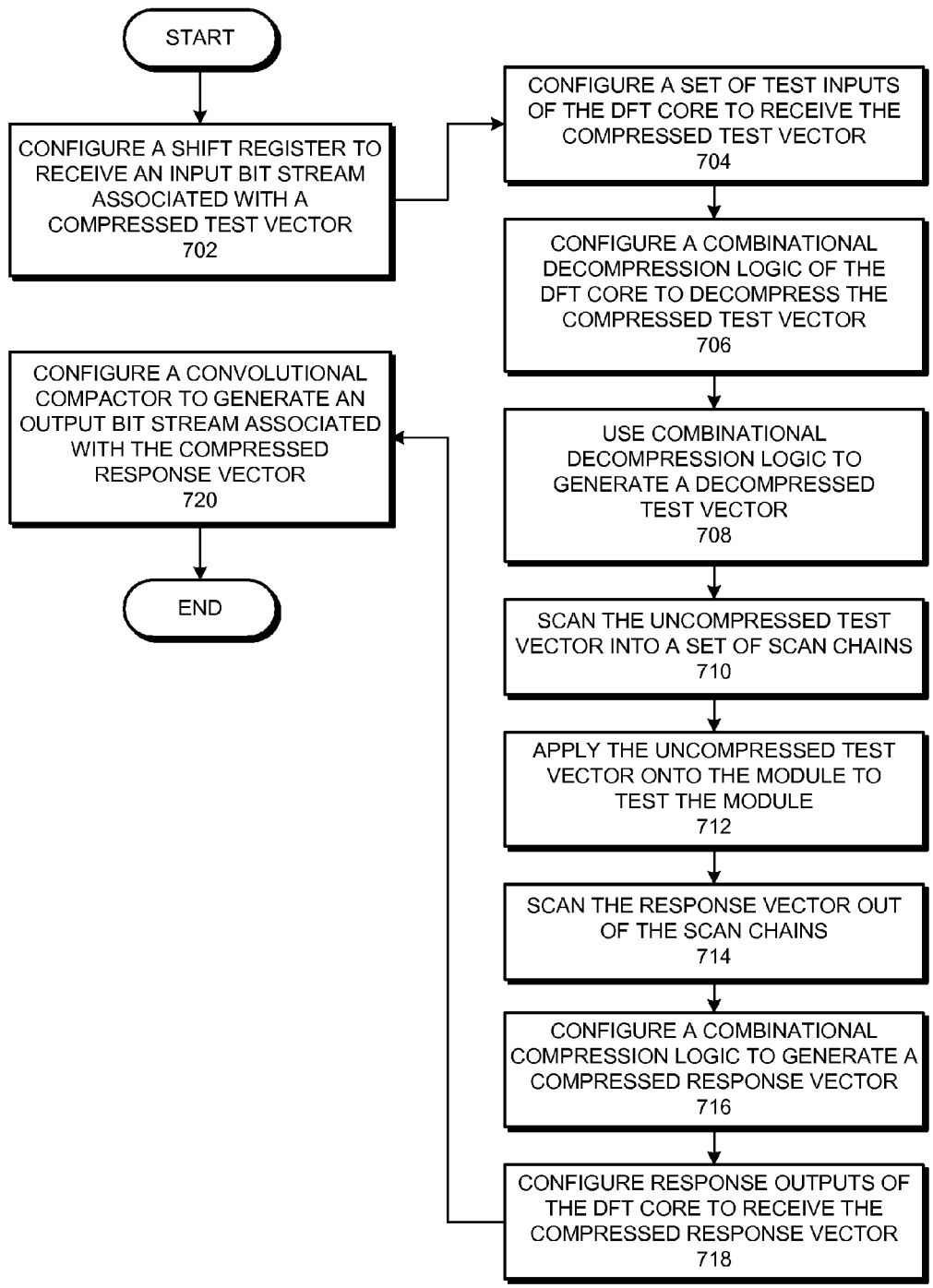
FIG. 7 presents a flow chart illustrating a process performed by a computing system for testing a circuit in accordance with an embodiment.

FIG. 7 presents a flow chart illustrating a process for testing a circuit in accordance with an embodiment. In some embodiments, the process can be performed by a computer system, which includes a computer-readable storage medium storing instructions that when executed by the computer system cause the computer system to perform the process. The system can begin by configuring a first series of flip-flops (i.e., shift register) to receive an input bit stream associated with the compressed test vector (operation 702). In doing so, the system couples an output of a first flip-flop in the first series of flip-flops to a first test input in the set of test inputs for a DFT core.

The system also configures a DFT core to perform a test on a module of a CUT. To do so, the system configures a set of test inputs of the DFT core to receive a compressed test vector (operation 704), and configures a combinational decompression logic of the DFT core to decompress the compressed test vector (operation 706). Next, the system generates an uncompressed test vector by using the combinational decompression logic (operation 708), and scans the uncompressed test vector into a set of scan chains (operation 710). At this point, the system applies the uncompressed test vector onto the module (operation 712), by enabling the uncompressed test vector to propagate through the logic of the module, and configuring the scan chains to gather a response vector from the module. Then, the system scans the response vector out of the set of scan chains (operation 714), and configures a combinational compression logic to generate a compressed response vector by compressing the response vector (operation 716). The system then configures a set of response outputs of the DFT core to receive the compressed response vector (operation 718).

Furthermore, the system configures a second series of flip-flops (i.e., convolutional compactor) to generate an output bit stream associated with the compressed response vector (operation 720). In doing so, the system couples a first response output in the set of response outputs to an input of a second flip-flop in the second series of flip-flops.

Figure 8:
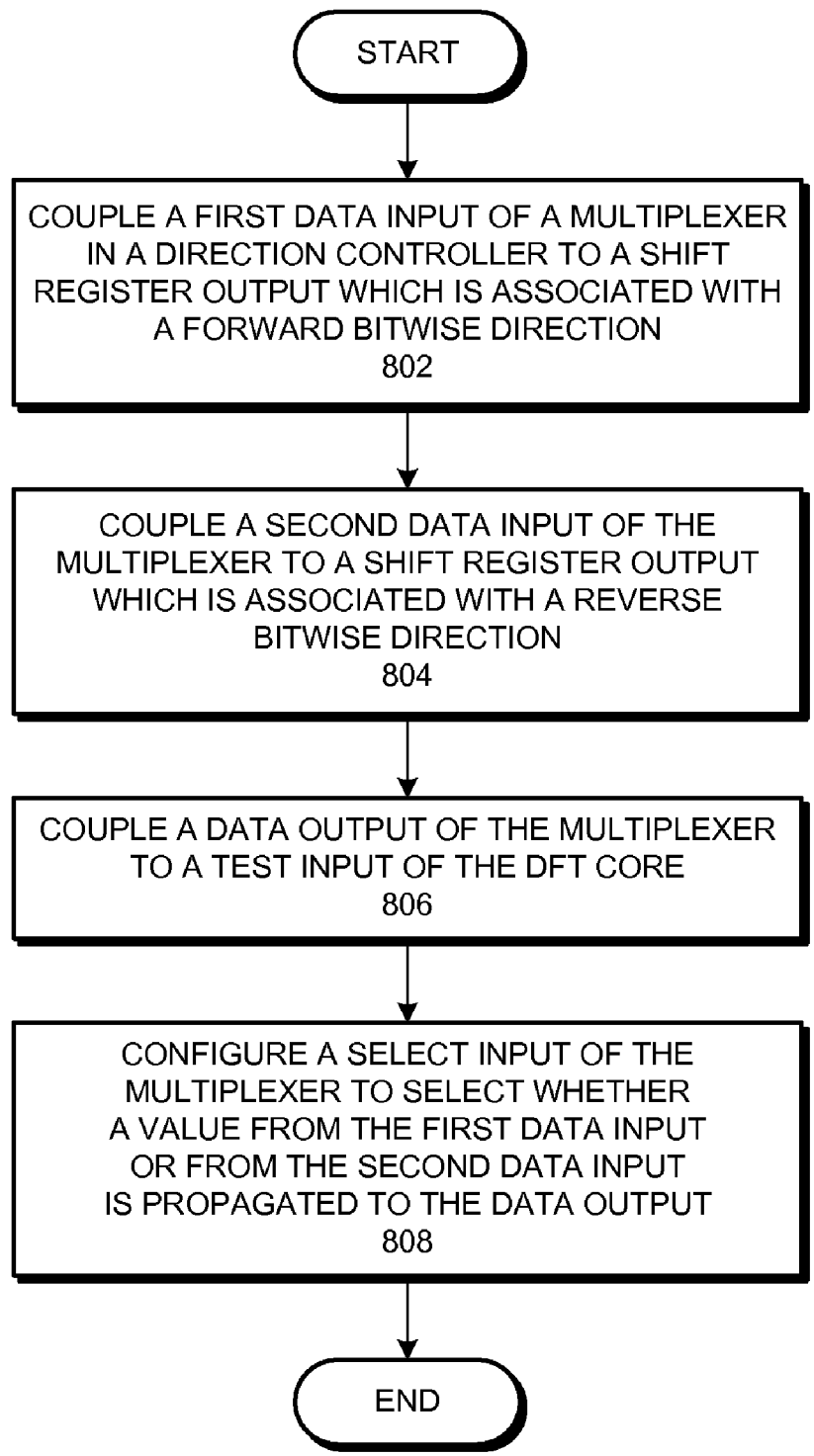
FIG. 8 presents a flow chart illustrating a process performed by the computing system for configuring a set of multiplexers to interface the outputs of a shift register with the test inputs of a DFT core in accordance with an embodiment.

FIG. 8 presents a flow chart illustrating a process for configuring a set of multiplexers (i.e., a direction controller) to interface the outputs of a shift register with the test inputs of a DFT core in accordance with an embodiment. To do so, the system couples a first data input of a multiplexer in the direction controller to a corresponding shift register output which is associated with a forward bitwise direction (operation 802). Then, the system couples a second data input of the multiplexer to the output of a second flip-flop in the shift register which is associated with a reverse bitwise direction (operation 804). Next, the system couples a data output of the multiplexer to a corresponding test input of the DFT core (operation 806), and configures a select input of the multiplexer to select whether the first data input's value or the second data input's value propagates to the data output (operation 808). In some embodiments, the select input of the multiplexer is coupled to a direction input signal, which specifies whether the direction controller is to propagate the compressed test vector in a forward or in a reverse bitwise direction.

Figure 9:
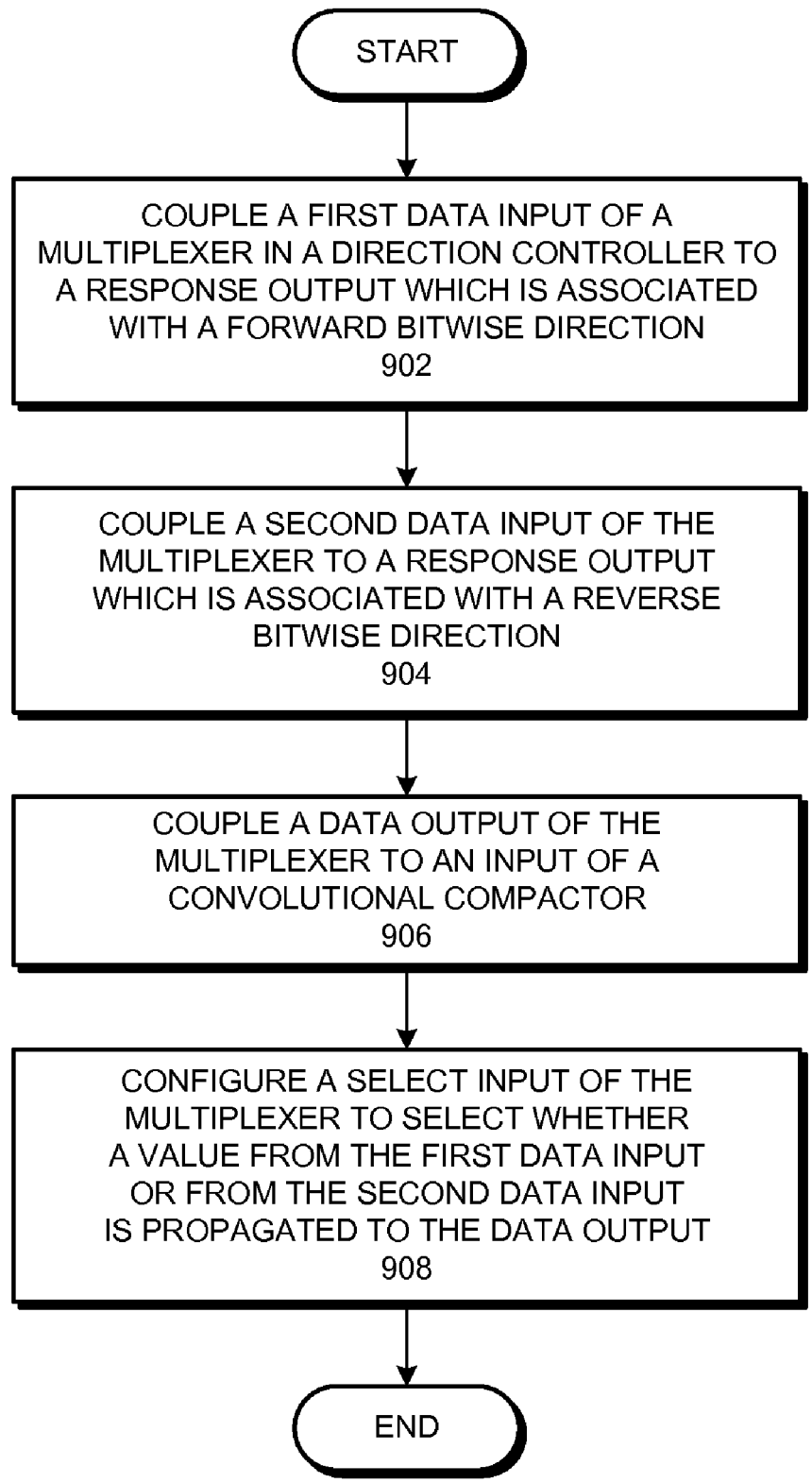
FIG. 9 presents a flow chart illustrating a process for configuring a set of multiplexers to interface the set of response outputs of the DFT core with the inputs to a convolutional compactor.

FIG. 9 presents a flow chart illustrating a process for configuring a set of multiplexers (i.e., a direction controller) to interface the set of response outputs of the DFT core with the inputs to a convolutional compactor. The system couples a first data input of a multiplexer in the direction controller to the first response output in the set of response outputs which is associated with a forward bitwise direction (operation 902). Then, the system couples a second data input of the multiplexer to a response output in the set of response outputs which is associated with a reverse bitwise direction (operation 904). Next, the system couples a data output of the multiplexer to an input of the convolutional compactor (operation 906), and configures a select signal of the multiplexer to select whether the first data input's value or the second data input's value propagates to the data output (operation 908). In some embodiments, the select input of the multiplexer is coupled to a direction input signal, which specifies whether the direction controller is to propagate the compressed response vector in a forward or in a reverse bitwise direction.

Figure 10:
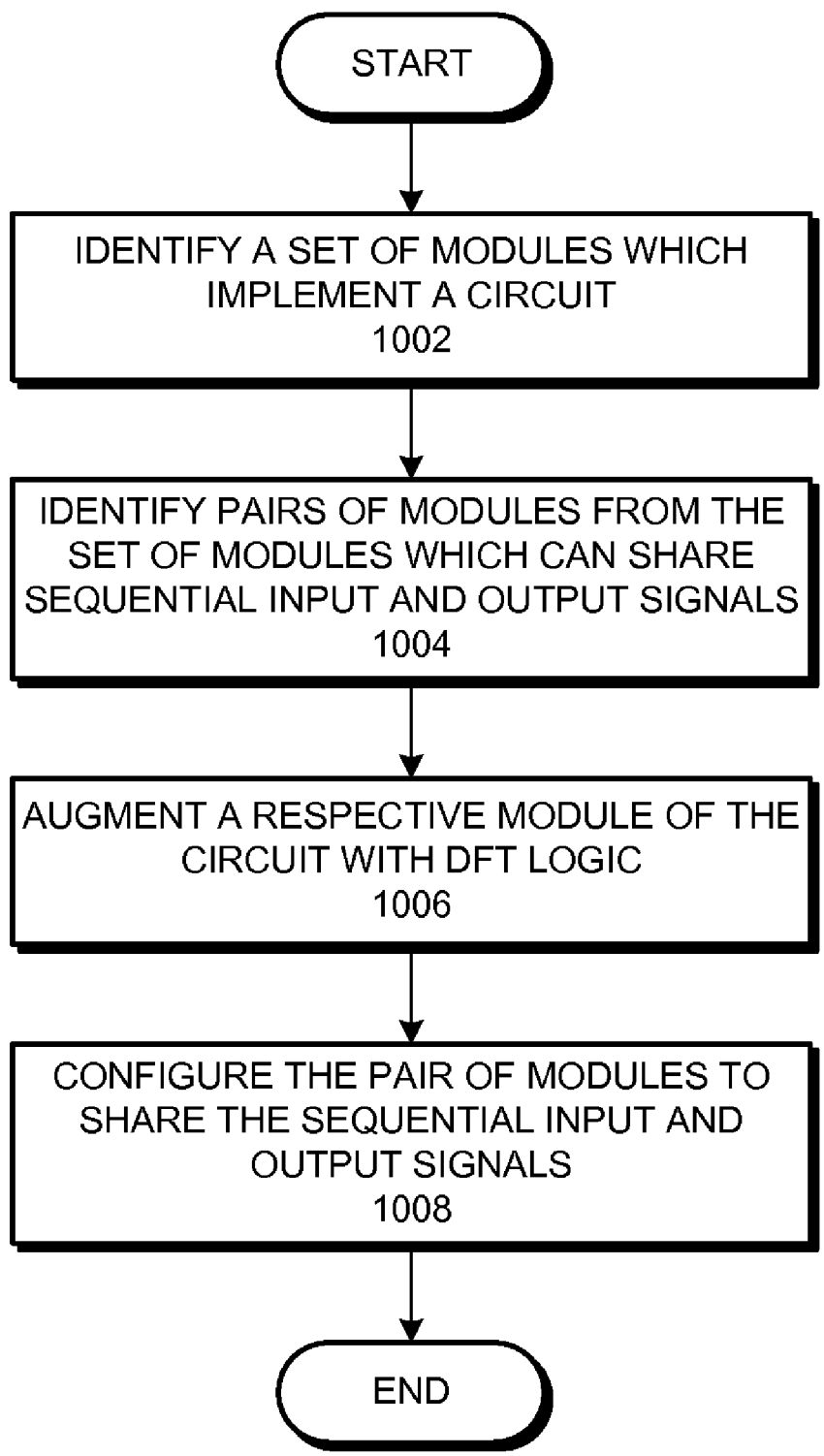
FIG. 10 presents a flow chart illustrating a process for configuring a hierarchical DFT logic for a circuit with more than one module in accordance with an embodiment.

FIG. 10 presents a flow chart illustrating a process for configuring a hierarchical DFT logic for a circuit with more than one module in accordance with an embodiment. The system first identifies the set of modules which implement the circuit (operation 1002), and identifies pairs of modules from the set of modules which can share sequential input and output signals (operation 1004). Then, the system can augment a respective module of the circuit with DFT logic (operation 1006), and configure the pair of modules to share the sequential input and output signals (operation 1008).

In some embodiments, two modules can be augmented with hierarchical DFT logic to share sequential input and output signals when the two modules are neighboring modules. In other embodiments, two modules can be augmented with hierarchical DFT when the two modules implement the same (or substantially similar) functionality, or when the two modules have an overlap in their sets of test vectors. To implement a hierarchical DFT logic configuration, the system couples an output signal from the shift register of a first module with the sequential input signal of a second module, and couples the sequential response signal of the first module with an input to an exclusive-OR operator associated with the convolutional compactor of the second module.

Figure 11:
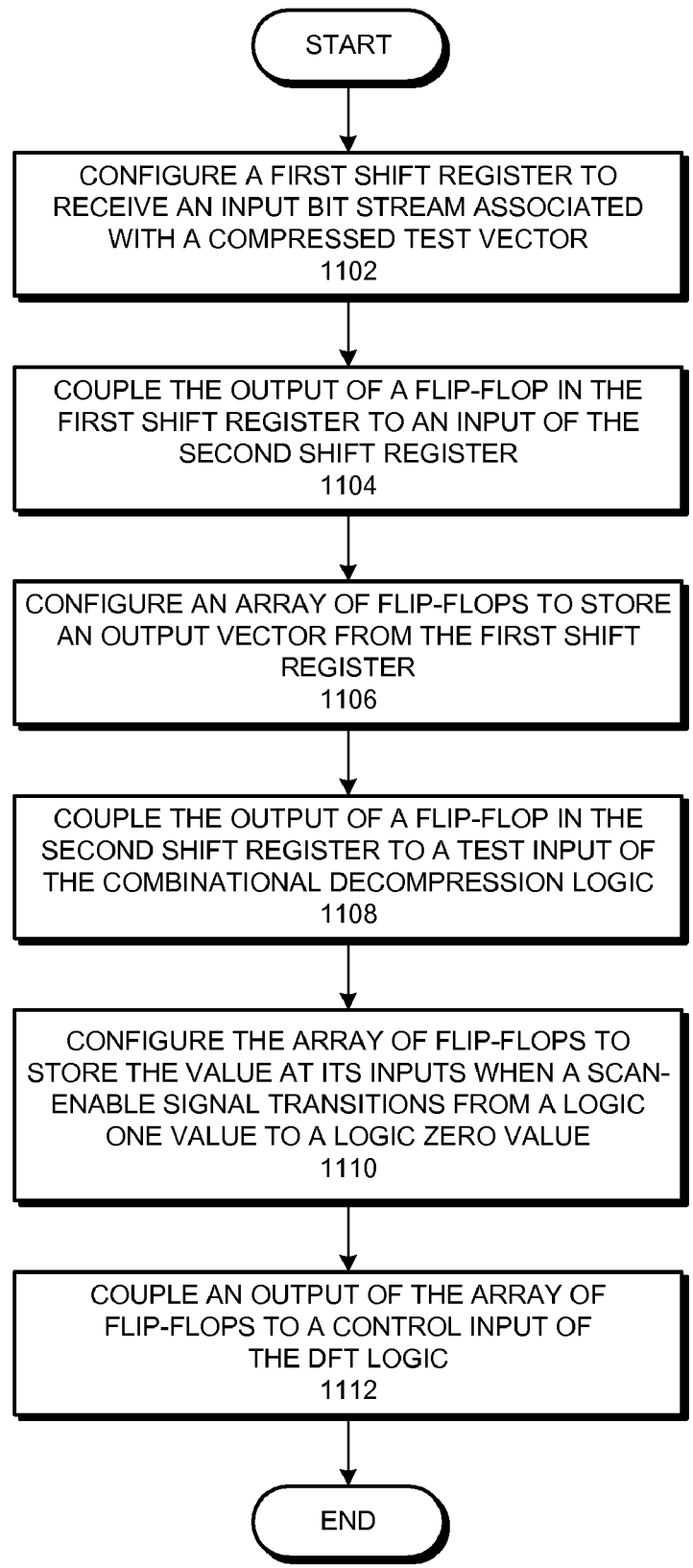
FIG. 11 presents a flow chart illustrating a process for configuring an array of flip-flops to provide a constant input vector to the combinational decompression logic in accordance with an embodiment.

FIG. 11 presents a flow chart illustrating a process for configuring an array of flip-flops to provide a constant input vector to the combinational decompression logic in accordance with an embodiment. The system configures a first shift register to interface the sequential input signal with a second shift register of the DFT logic, and with an array of flip-flops that propagate a stored test vector to the DFT logic. In doing so, the system configures the first shift register to receive the input bit stream associated with the compressed test vector (operation 1102). Next, the system couples the output of a flip-flop in the first shift register to an input of the second shift register (operation 1104). The system then configures the array of flip-flops to store an output vector from the first shift register (operation 1106), and couples the output of a flip-flop in the second shift register to a test input of the combinational decompression logic (operation 1108). The system also configures the array of flip-flops to store the value at its inputs when a scan-enable signal transitions from a logic one value to a logic zero value (operation 1110). In some variations, the system configures the array of flip-flops to store the value at its inputs when the scan-enable signal transitions from a logic zero value to a logic one value. Then, system configures an output of the array of flip-flops to a control input of the DFT logic (operation 1112).

Computing System

Figure 12:
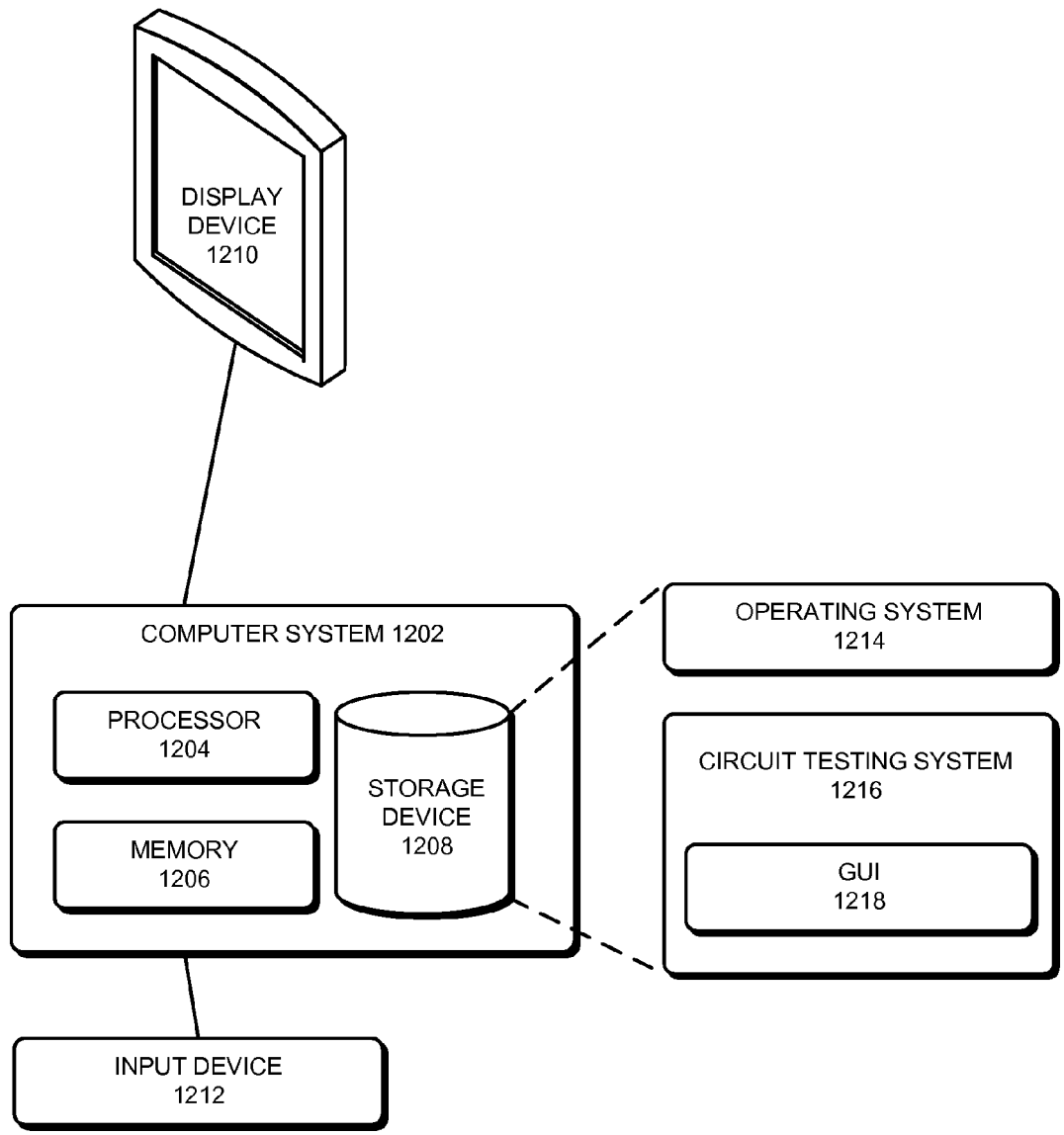
FIG. 12 illustrates an exemplary computer system that facilitates configuring a DFT logic for performing tests on a CUT in accordance with an embodiment.

FIG. 12 illustrates an exemplary computer system that facilitates configuring a DFT logic for performing tests on a CUT in accordance with an embodiment. Computer system 1202 includes a processor 1204, a memory 1206, and a storage device 1208. Furthermore, computer system 1202 can be coupled to a display device 1210 and an input device 1212.

Storage device 1208 stores an operating system 1214, and a circuit testing system 1216. Circuit testing system 1216 can include a graphical user interface (GUI) 1218. During operation, circuit testing system 1216 is loaded from storage device 1208 into memory 1206 and is executed by processor 1204. In some variations, circuit testing system 1216 can be implemented in a hardware module, such as an ASIC or an FPGA.

In some embodiments, circuit testing system 1216 can configure the DFT logic in a module of a CUT. For example, circuit testing system 1216 can configure a shift register to receive a sequential input signal, and provide a DFT core with compressed test vectors and mode control values. Circuit testing system 1216 can also configure the DFT core to receive the compressed test vectors, decompress the test vectors, and scan the decompressed test vectors into a number of scan chains for testing the module. Circuit testing system 1216 can also configure a combinational compressor of the DFT core to scan out a response vector from the number of scan chains, and to compress the response vector before propagating the compressed response vector to a convolutional compactor. Furthermore, circuit testing system 1216 can configure the convolutional compactor to transform a sequence of compressed response vectors into a sequential response signal.

In other embodiments, circuit testing system 1216 can configure a hierarchical DFT logic for testing a number of modules of the CUT. In doing so, circuit testing system 1216 can couple an output signal from the shift register of a first module with the sequential input signal of a second module, and can couple the sequential response signal of the first module with an input to an exclusive-OR operator associated with the convolutional compactor of the second module.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. An method for testing a circuit, the method comprising:
configuring, by computer, a first design-for-test (DFT) core to perform a test on a first module of the circuit, by:
configuring a set of test inputs of the DFT core to receive a compressed test vector;
configuring a combinational decompression logic of the first DFT core to generate an uncompressed test vector by decompressing the compressed test vector, wherein the uncompressed test vector is scanned into a set of scan chains;
configuring a combinational compression logic to generate a compressed response vector by compressing a response vector, wherein the response vector is scanned out of the set of scan chains; and
configuring a set of response outputs of the first DFT core to receive the compressed response vector;
configuring a first series of flip-flops to receive an input bit stream associated with the compressed test vector, wherein an output of a first flip-flop in the first series of flip-flops is coupled to a first test input in the set of test inputs;
configuring a second series of flip-flops to generate a first output bit stream associated with the compressed response vector, wherein a first response output in the set of response outputs is coupled to an input of a first flip flop in the second series of flip flops; and
configuring a first set of multiplexers to interface the outputs of the first series of flip-flops with the set of test inputs of the first DFT core, wherein the first set of multiplexers are used to input the compressed test vector into the test inputs of the first DFT core in a forward direction or in a backward direction.

2. The method of claim 1, further comprising:
coupling a first data input of a multiplexer in the first set of multiplexers to the output of the first flip-flop in the first series of flip-flops,
coupling a second data input of the multiplexer in the first set of multiplexers to the output of a third flip-flop in the first series of flip-flops,
coupling a first data output of the multiplexer in the first set of multiplexers to the first test input of the first DFT core, and
configuring a select input of the multiplexer in the first set of multiplexers to select whether the first data input's value or the second data input's value propagates to the first data output.

3. The method of claim 1, further comprising configuring a second set of multiplexers to interface the set of response outputs of the first DFT core with the inputs to the second series of flip-flops, wherein the second set of multiplexers are used to input the compressed response vector into the inputs to the second series of flip-flops in a forward direction or in a backward direction.

4. The method of claim 3, further comprising:
coupling a third data input of a multiplexer in the second set of multiplexers to the first response output in the set of response outputs,
coupling a fourth data input of the multiplexer in the second set of multiplexers to a second response output in the set of response outputs,
coupling a second data output of the multiplexer in the second set of multiplexers to the input of the first flip-flop in the second series of flip-flops, and
configuring a select signal of the multiplexer in the second set of multiplexers to select whether the third data input's value or the fourth data input's value propagates to the second data output.

5. The method of claim 1, further comprising:
coupling the output of a flip-flop in the first series of flip-flops to an input of a flip-flop in a third series of flip-flops, and configuring the third series of flip-flops to receive the input bit stream for a second DFT core; and
coupling the output of a flip-flop in the second series of flip-flops to an input of a flip-flop in a fourth series of flip-flops, and configuring the fourth series of flip-flops to generate a second output bit stream based in part on the second DFT core's outputs.

6. The method of claim 1, further comprising:
configuring a fifth series of flip-flops to receive the input bit stream associated with the compressed test vector, wherein the output of a flip-flop in the fifth series of flip-flops is coupled to an input of a flip-flop in the first series of flip-flops; and
configuring an array of flip-flops to store an output vector from the fifth series of flip-flops, wherein the array of flip-flops is used to provide constant input values to the combinational decompression logic.

7. The method of claim 1, wherein the input of a second flip-flop in the second series of flip-flops is coupled to an output of an exclusive-OR operator, wherein a first input of the exclusive-OR operator is coupled to an output of a third flip-flop in the second series of flip-flops, and wherein a second input of the exclusive-OR operator is coupled to a third response output in the set of response outputs.

8. A non-transitory computer-readable storage medium storing instructions that when executed by a computer cause the computer to perform a method for testing a circuit, the method comprising:
configuring a first design-for-test (DFT) core to perform a test on a first module of the circuit, by:
configuring a set of test inputs of the DFT core to receive a compressed test vector;
configuring a combinational decompression logic of the first DFT core to generate an uncompressed test vector by decompressing the compressed test vector, wherein the uncompressed test vector is scanned into a set of scan chains;
configuring a combinational compression logic to generate a compressed response vector by compressing a response vector, wherein the response vector is scanned out of the set of scan chains; and
configuring a set of response outputs of the first DFT core to receive the compressed response vector;
configuring a first series of flip-flops to receive an input bit stream associated with the compressed test vector, wherein an output of a first flip-flop in the first series of flip-flops is coupled to a first test input in the set of test inputs;
configuring a second series of flip-flops to generate a first output bit stream associated with the compressed response vector, wherein a first response output in the set of response outputs is coupled to an input of a first flip flop in the second series of flip flops; and
configuring a first set of multiplexers to interface the outputs of the first series of flip-flops with the set of test inputs of the first DFT core, wherein the first set of multiplexers are used to input the compressed test vector into the test inputs of the first DFT core in a forward direction or in a backward direction.

9. The non-transitory computer-readable storage medium of claim 8, further comprising:
coupling a first data input of a multiplexer in the first set of multiplexers to the output of the first flip-flop in the first series of flip-flops,
coupling a second data input of the multiplexer in the first set of multiplexers to the output of a third flip-flop in the first series of flip-flops,
coupling a first data output of the multiplexer in the first set of multiplexers to the first test input of the first DFT core, and
configuring a select input of the multiplexer in the first set of multiplexers to select whether the first data input's value or the second data input's value propagates to the first data output.

10. The non-transitory computer-readable storage medium of claim 8, further comprising configuring a second set of multiplexers to interface the set of response outputs of the first DFT core with the inputs to the second series of flip-flops, wherein the second set of multiplexers are used to input the compressed response vector into the inputs to the second series of flip-flops in a forward direction or in a backward direction.

11. The non-transitory computer-readable storage medium of claim 10, further comprising:
coupling a third data input of a multiplexer in the second set of multiplexers to the first response output in the set of response outputs,
coupling a fourth data input of the multiplexer in the second set of multiplexers to a second response output in the set of response outputs,
coupling a second data output of the multiplexer in the second set of multiplexers to the input of the first flip-flop in the second series of flip-flops, and
configuring a select signal of the multiplexer in the second set of multiplexers to select whether the third data input's value or the fourth data input's value propagates to the second data output.

12. The non-transitory computer-readable storage medium of claim 8, further comprising:
coupling the output of a flip-flop in the first series of flip-flops to an input of a flip-flop in a third series of flip-flops, and configuring the third series of flip-flops to receive the input bit stream for a second DFT core; and
coupling the output of a flip-flop in the second series of flip-flops to an input of a flip-flop in a fourth series of flip-flops, and configuring the fourth series of flip-flops to generate a second output bit stream based in part on the second DFT core's outputs.

13. The non-transitory computer-readable storage medium of claim 8, further comprising:
configuring a fifth series of flip-flops to receive the input bit stream associated with the compressed test vector, wherein the output of a flip-flop in the fifth series of flip-flops is coupled to an input of a flip-flop in the first series of flip-flops; and
configuring an array of flip-flops to store an output vector from the fifth series of flip-flops, wherein the array of flip-flops is used to provide constant input values to the combinational decompression logic.

14. The non-transitory computer-readable storage medium of claim 8, wherein the input of a second flip-flop in the second series of flip-flops is coupled to an output of an exclusive-OR operator, wherein a first input of the exclusive-OR operator is coupled to an output of a third flip-flop in the second series of flip-flops, and wherein a second input of the exclusive-OR operator is coupled to a third response output in the set of response outputs.

15. An apparatus for testing a circuit, the apparatus comprising:
a first design-for-test (DFT) core, comprising:
a set of test inputs configured to receive a compressed test vector;
a combinational decompression logic configured to decompress the compressed test vector to generate an uncompressed test vector, wherein the uncompressed test vector is scanned into a set of scan chains;
a combinational compression logic configured to generate a compressed response vector by compressing a response vector, wherein the response vector is scanned out of the set of scan chains; and
a set of response outputs configured to receive the compressed response vector;
a first series of flip-flops configured to receive an input bit stream associated with the compressed test vector, wherein an output of a first flip-flop in the first series of flip-flops is coupled to a first test input in the set of test inputs;
a second series of flip-flops configured to generate a first output bit stream associated with the compressed response vector, wherein a first response output in the set of response outputs is coupled to an input of a first flip flop in the second series of flip flops; and
a first set of multiplexers configured to interface the outputs of the first series of flip-flops with the set of test inputs of the first DFT core, wherein the first set of multiplexers are used to input the compressed test vector into the test inputs of the first DFT core in a forward direction or in a backward direction.

16. The apparatus of claim 15, wherein a first data input of a multiplexer in the first set of multiplexers is coupled to the output of the first flip-flop in the first series of flip-flops,
wherein a second data input of the multiplexer in the first set of multiplexers is coupled to the output of a third flip-flop in the first series of flip-flops,
wherein a first data output of the multiplexer in the first set of multiplexers is coupled to the first test input of the first DFT core, and
wherein a select input of the multiplexer in the first set of multiplexers is configured to select whether the first data input's value or the second data input's value propagates to the first data output.

17. The apparatus of claim 15, wherein a third data input of a multiplexer in the second set of multiplexers is coupled to the first response output in the set of response outputs,
wherein a fourth data input of the multiplexer in the second set of multiplexers is coupled to a second response output in the set of response outputs,
wherein a second data output of the multiplexer in the second set of multiplexers is coupled to the input of the first flip-flop in the second series of flip-flops, and
wherein a select signal of the multiplexer in the second set of multiplexers is configured to select whether the third data input's value or the fourth data input's value propagates to the second data output.

18. The apparatus of claim 15, further comprising a second set of multiplexers configured to interface the set of response outputs of the first DFT core with the inputs to the second series of flip-flops, wherein the second set of multiplexers are used to input the compressed response vector into the inputs to the second series of flip-flops in a forward direction or in a backward direction.

19. The apparatus of claim 15, wherein the output of a flip-flop in the first series of flip-flops is coupled to an input of a flip-flop in a third series of flip-flops, wherein the third series of flip-flops is configured to receive the input bit stream for a second DFT core; and
wherein the output of a flip-flop in the second series of flip-flops is coupled to an input of a flip-flop in a fourth series of flip-flops, wherein the fourth series of flip-flops is configured to generate a second output bit stream based in part on the second DFT core's outputs.

20. The apparatus of claim 15, further comprising:
a fifth series of flip-flops, wherein the output of a flip-flop in the fifth series of flip-flops is coupled to an input of a flip-flop in the first series of flip-flops; and
an array of flip-flops configured to store an output vector from the fifth series of flip-flops, wherein the array of flip-flops is used to provide constant input values to the combinational decompression logic.

21. The apparatus of claim 15, wherein the input of a second flip-flop in the second series of flip-flops is coupled to an output of an exclusive-OR operator, wherein a first input of the exclusive-OR operator is coupled to an output of a third flip-flop in the second series of flip-flops, and wherein a second input of the exclusive-OR operator is coupled to a third response output in the set of response outputs.

* * * * *